United States Patent [19]

Nakagawara et al.

[11] Patent Number: 4,942,369

[45] Date of Patent: Jul. 17, 1990

[54] CONTROLLED CURRENT PRODUCING DIFFERENTIAL CIRCUIT APPARATUS

[75] Inventors: Chikashi Nakagawara; Akihiro Murayama, both of Kanagawa; Shigeru Nakamura, Nigata, all of Japan

[73] Assignee: Kabushiki Kaisha Toshiba, Kanagawa, Japan

[21] Appl. No.: 170,376

[22] Filed: Mar. 18, 1988

[30] Foreign Application Priority Data

Mar. 20, 1987 [JP] Japan .................................. 62-64215
Mar. 30, 1987 [JP] Japan .................................. 62-76641

[51] Int. Cl.[5] .............................................. H03F 3/04

[52] U.S. Cl. .................................... 330/296; 323/314; 323/316; 330/297

[58] Field of Search ................ 330/296, 297; 323/314, 323/316, 315; 361/110

[56] References Cited

U.S. PATENT DOCUMENTS 3,932,768 1/1976 Takahashi et al. .................. 323/235
4,352,056 9/1982 Cave et al. .......................... 323/214
4,629,972 12/1986 Briner et al. ......................... 323/314
4,704,654 11/1987 Aberle et al. ....................... 323/316
4,779,059 10/1988 Taki et al. ....................... 323/316 X

*Primary Examiner*—M. H. Paschall
*Assistant Examiner*—Jeffrey A. Gaffin
*Attorney, Agent, or Firm*—Finnegan, Henderson, Farabow, Garrett and Dunner

[57] ABSTRACT

A controlled current producing differential circuit apparatus for outputting a controlled stable current despite changes in a power supply voltage subject to unexpected fluctuation. The apparatus includes a control voltage supply source for supplying a control voltage in response to the power supply voltage, a reference voltage supply source responsive to the power supply voltage for supplying a predetermined reference voltage, and a differential circuit coupled to the control voltage supply source and the reference voltage supply source for outputting the controlled stable current in response to the difference between the control voltage and the reference voltage and for compensating for fluctuations in the power supply voltage.

9 Claims, 8 Drawing Sheets

CONTROLLED CURRENT PRODUCING DIFFERENTIAL CIRCUIT APPARATUS

FIELD OF THE INVENTION

The present invention relates generally to a differential circuit apparatus, and more particularly, to a controlled current producing differential circuit apparatus.

BACKGROUND OF THE INVENTION

Conventionally, a controlled current producing differential circuit apparatus has been used for obtaining a controlled current.

Referring now to FIG. 1, an example of the conventional controlled current producing differential circuit apparatus will be described. An equivalent of the conventional controlled current producing differential circuit apparatus is, for example, disclosed in Japanese Patent No. P56-42169 B2 (Tokkaisho 56-42169) issued on October 2, 1981. In FIG. 1, the conventional controlled current producing differential circuit apparatus is provided with a differential circuit 10, a control voltage supply circuit 12, a reference voltage supply circuit 14 and a power voltage supply source 16. The control voltage supply circuit 12 and the reference voltage supply circuit 14 supply the differential circuit 10 with a control voltage Vc and a prescribed reference voltage Vr, which are described later. The power voltage supply source 16 has a prescribed power source voltage Vcc.

The differential circuit 10 is constituted by a pair of transistors 18a and 18b and a current source 20. The current source 20 supplies an input current Iin subject to control by the control apparatus. The emitters of the transistors 18a and 18b are connected to the current source 20 through emitter resistors 22a and 22b, respectively. The bases of the transistors 18a and 18b are coupled to the control voltage supply circuit 12 and the reference voltage supply circuit 14 through resistors 24a and 24b, respectively. Further, the base of the transistor 18a is coupled to the reference voltage supply circuit 14 through a resistor 24c.

The control voltage supply circuit 12 is constituted by a variable resistor 26 coupled across the power voltage supply source 16. An output terminal 26a of the variable resistor 26 is coupled to the differential circuit 10 through an output terminal 12a for outputting the control voltage Vc.

In control voltage supply circuit 12, the output terminal 12a outputs the control voltage Vc. When assuming the impedance Z26 of the variable resistor 26 is sufficiently lower than the resistance R24a of the resistor 24a (Z26<R24a), the control voltage Vc is given as follows in reference to the power source voltage Vcc of power voltage supply source 16 and the control ratio α of the variable resistor 26;

$$Vc=\alpha . Vcc \quad (1)$$

where α is a fraction less than one ($0 \leqq \alpha \leqq 1$).

The reference voltage supply circuit 14 is constituted by a transistor 28, two diodes 30a and 30b and three resistors 32a, 32b and 32c. The collector of the transistor 28 is coupled to the positive terminal of the power voltage supply source 16. The emitter of the transistor 28 is coupled to the negative terminal of the power voltage supply source 16 through the resistor 32a. The base of the transistor 28 is coupled to the positive terminal of the power voltage supply source 16 through the resistor 32b. Further, the base of the transistor 28 is coupled to the negative terminal of the power voltage supply source 16 through a series circuit of the diodes 30a, 30b and the resistor 32c. The emitter of the transistor 28 is coupled to the differential circuit 10 through a reference voltage output terminal 14a for outputting the reference voltage Vr.

In an integrated circuit configuration, the diodes 30a and 30b are made by a form of transistor, similar to the transistor 28 and the like. Therefore, the forward voltage drop of diodes, such as the diodes 30a and 30b, and the forward base-emitter junction voltage of transistors, such as the transistor 28, present the same prescribed voltage Vf. Therefore, the emitter potential of the transistor 28 becomes equal to the potential on the connection node between the diodes 30a and 30b. Provided the resistances R32b and R32c of the resistor 32b and 32c are equal to each other (R32b=R32c), the potential on the connection node becomes half of the power source voltage Vcc of power voltage supply source 16. As a result, the reference voltage Vr obtained on the emitter of the transistor 28 is given as follows:

$$Vr=(\tfrac{1}{2}).Vcc \quad (2)$$

The control voltage Vc and the reference voltage Vr are applied to the bases of the transistors 18a and 18b through the resistors 24a and 24b, respectively. When assuming the impedance Z26 of the variable resistor 26 is sufficiently lower than the sum of the resistances R24a and R24c of the resistors 24a and 24c (Z26<(R-24a+R24c)), the base potential Vba of the transistor 18a is given as follows;

$$Vba=[R24c/(\alpha.R24a+R24c)].(Vc-Vr)+Vr$$

The base potential Vbb of the transistor 18b is also given as follows;

$$Vbb=Vr \quad (4)$$

When assuming the resistances R24a and R24b have the same resistance R24, the potential difference ΔV between the base potentials Vba and Vbb is given as follows;

$$\begin{aligned} \Delta V &= Vba - Vbb \\ &= [R24c/(\alpha \cdot R24a + R24c)] \cdot (Vc - Vr) \\ &= [R24c/(R24a + R24c)] \cdot (\alpha - 1/2) \cdot Vcc \end{aligned} \quad (5)$$

The potential difference ΔV, therefore, varies in accordance with the control ratio α of the variable resistor 26. This is done by controlling the variable resistor 26. When assuming the potential difference ΔV is sufficiently smaller than the voltage drops V22a and V22b across the emitter resistors 22a and 22b, respectively, collector currents Ic.18a and Ic.18b of the transistors 18a and 18b vary differentially in proportion to the potential difference ΔV.

As a result, the conventional differential circuit control apparatus can control the output currents Ic.18a and Ic.18b in accordance with the control of the variable resistor 26.

However, the conventional controlled current producing differential circuit apparatus has a drawback as follows. As shown by Equation 5, the potential difference ΔV is not only a function of the control ratio α, but also a function of the power source voltage Vcc. Therefore, the output current obtained as the collector current flowing through the transistor 18a and/or 18b varies unexpectedly, if the power source voltage Vcc is not stabilized.

Further, the resistances R22a and R22b of the emitter resistors 22a and 22b are required to be relatively large for causing voltage drops V22a and V22b sufficiently larger than the potential difference ΔV. However, the varying range of the output current I18a and/or I18b is reduced in reverse proportion to the resistances R22a and R22b of the emitter resistors 22a and 22b.

If the resistances R22a and R22b of the emitter resistors 22a and 22b are decreased for enlarging the varying range of the output current, the potential difference ΔV is apt to be affected by the thermal voltage Vt of transistors, such as the transistors 18a and 18b. The thermal voltage Vt of transistors is given as follows;

$$Vt = K.T/q$$

where K is Boltzman's constant, T is absolute temperature and q is the electric charge of an electron.

Therefore, the output current I18a and/or I18b varies due to not only changes in the power supply voltage Vcc but also changes in temperature. Further, the varying ranges of the output current I18a and/or I18b are affected by the impedance of the control voltage supply source 12 and the reference voltage supply source 14.

SUMMARY OF THE INVENTION

It is, therefore, an object of the present invention to provide a controlled current producing differential circuit apparatus which is able to output a controlled stable current despite changes in the power supply voltage.

Another object of the present invention is to provide a controlled current producing differential circuit apparatus which is able to control current over a wider range.

Still another object of the present invention is to provide a controlled current producing differential circuit apparatus which is able to output a controlled stable current despite changes in ambient temperature.

In order to achieve the above object, a controlled current producing differential circuit apparatus according to one aspect of the present invention includes a control voltage supply source for supplying a control voltage in response to the power supply voltage, a reference voltage supply source responsive to the power supply voltage for supplying a predetermined reference voltage, and a differential circuit coupled to the control voltage supply source and the reference voltage supply source for supplying the controlled stable current in response to the difference between the control voltage and the reference voltage and for compensating for fluctuations in the power supply voltage.

Additional objects and advantages of the controlled current producing differential circuit apparatus according to present invention will be apparent to persons skilled in the art from a study of the following description and the accompanying drawings, which are hereby incorporated in and constituted a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6(*a*) is a schematic circuit diagram showing a modification of the compensation voltage producing circuit 72 of FIG. 6.

DESCRIPTION OF THE PREFERRED EMBODIMENTS

Figure 1:
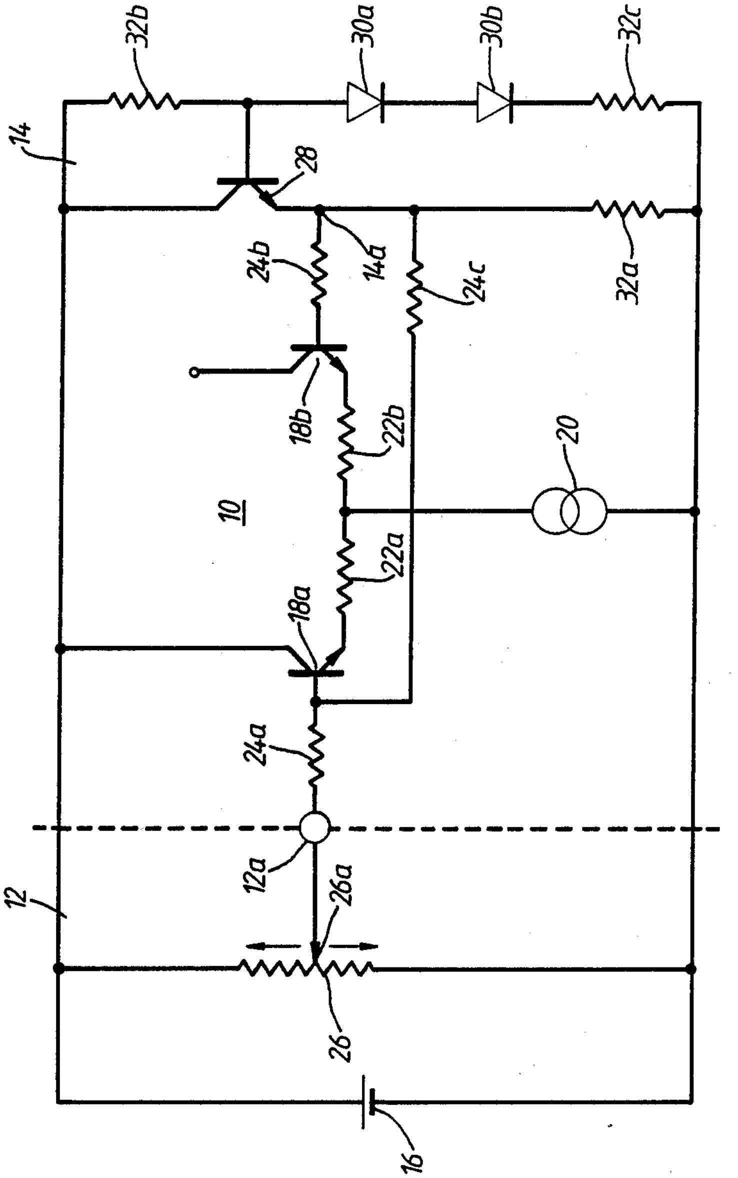
FIG.1. (PRIOR ART)
FIG. 1 is a schematic circuit diagram showing an example of a conventional controlled current producing differential circuit apparatus.

The present invention will be described in detail with reference to FIGS. 2 through 7. Throughout the drawings, reference numerals or letters used in FIG. 1 (Prior Art) will be used to designate like or equivalent elements for simplicity of explanation.

Figure 2:
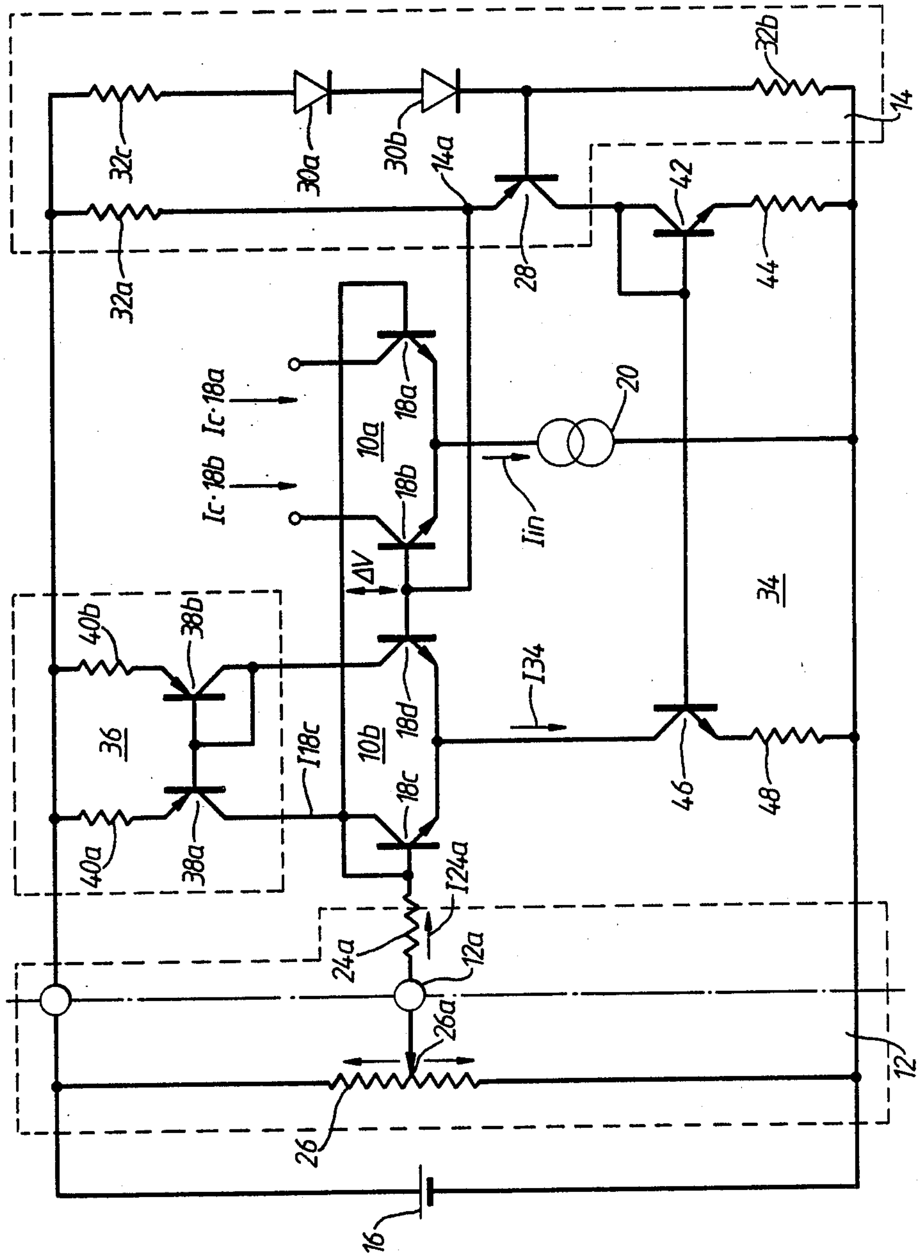
FIG. 2 is a schematic circuit diagram showing a first embodiment of the controlled current producing differential circuit apparatus according to the present invention.

Referring now to FIG. 2, a first embodiment of the control apparatus for a differential circuit according to the present invention will be described in detail.

In FIG. 2, the control apparatus is provided with a pair of first and second differential circuits 10a and 10b, a control voltage supply circuit 12, a reference voltage supply circuit 14 and a power voltage supply source 16. The control voltage supply circuit 12 and reference voltage supply circuit 14 supply the second differential circuit 10b with a control voltage Vc and a prescribed reference voltage Vr, which are described later. The power voltage supply source 16 has a power source voltage Vcc.

The first differential circuit 10a is constituted by a pair of transistors 18a and 18b and a current source 20. The current source 20 supplies an input current Iin subject to control by the control apparatus. The emitters of the transistors 18a and 18b are connected to the current source 20. The bases of the transistors 18a and 18b are coupled to the second differential circuit 10b, as described later. Both or either of the collector currents Ic18a and Ic18b of the transistors 18a and 18b are controlled outputs of the input current Iin supplied by the current source 20.

The second differential circuit 10b is constituted by a pair of transistors 18c and 18d, a current source 34 and a current feedback circuit 36. The current source 34 supplies a prescribed controlled current I34 to the transistors 18*c* and 18*d*. The emitters of the transistors 18*c* and 18*d* are connected to the current source 34. The base of the transistor 18*c* is coupled to the control voltage supply circuit 12 through a resistor 24*a*. Further, the base of the transistor 18*c* is coupled to the collector thereof so that the transistor 18*c* is formed in a diode fashion. The base of the transistor 18*d* is directly coupled to the reference voltage supply circuit 14. Further, the bases of the transistors 18*c* and 18*d* of the second differential circuit 10*b* are coupled to the bases of the transistors 18*a* and 18*b* of the first differential circuit 10*a*, respectively.

The current feedback circuit 36 is constituted by a pair of transistors 38*a* and 38*b* and a pair of resistors 40*a* and 40*b*. The collectors of the transistors 38*a* and 38*b* are coupled to the collectors of the transistors 18*c* and 18*d*, respectively. The emitters of the transistors 38*a* and 38*d* are coupled to the positive terminal of the power voltage supply source 16 through the resistors 40*a* and 40*b*, respectively. Further, the collector of the transistor 38*b* is commonly coupled to the base of the transistors 38*a* and 38*b*. Thus, the current feedback circuit 36 is formed in a current mirror fashion. The current feedback circuit 36 operates to feed back the collector current of the transistor 18*d* to the collector of the transistor 18*c* due to the current mirror fashion.

The control voltage supply circuit 12 is constituted by a variable resistor 26 coupled across the power voltage supply source 16. An output terminal 26*a* of the variable resistor 26 is coupled to the transistor 18*c* of the second differential circuit 10*b* through an output terminal 12*a* of the control voltage supply circuit 12. The output terminal 12*a* outputs the control voltage Vc from the control voltage supply circuit 12. The control voltage Vc is applied to the base of the transistor 18*c* through the resistor 24*a*.

The reference voltage supply circuit 14 is constituted by a transistor 28, two diodes 30*a* and 30*b* and three resistors 32*a*, 32*b* and 32*c*, like the equivalent circuit of FIG. 1. Further, the reference voltage supply circuit 14 includes a transistor 42 and a resistor 44. The transistor 42 and the resistor 44 constitute the current source 34 for the second differential circuit 10*b*, as described later.

The collector of the transistor 28 of the reference voltage supply circuit 14 is coupled to the negative terminal of the power voltage supply source 16 in series through the transistor 42 and the resistor 44. The emitter of the transistor 28 is coupled to the positive terminal of the power voltage supply source 16 through the resistor 32*a*. The base of the transistor 28 is coupled to the negative terminal of the power voltage supply source 16 through the resistor 32*b*. Further, the base of the transistor 28 is coupled to the positive terminal of the power voltage supply source 16 in series through the diodes 30*a* and 30*b* and the resistor 32*c*. The emitter of the transistor 28 is coupled to the first differential circuit 10*a* and second differential circuit 10*b* through a reference voltage output terminal 14*a* for outputting the reference voltage Vr. The reference voltage Vr is directly applied to the base of the transistor 18*b* of the second differential circuit 10*b*, as described before.

The diodes 30*a* and 30*b* are made by a form of transistor in an integrated circuit configuration, similar to the transistor 28 and the like, as described before. Therefore, the forward voltage drop of diodes, such as the doiodes 30*a* and 30*b*, and the forward base-emitter junction voltage of transistors, such as the transistor 28, present a prescribed voltage Vf. Therefore, the emitter potential of the transistor 28 becomes equal to the potential on the connection node between the diodes 30*a* and 30*b*. Providing the resistances R32*b* and R32*c* of the resistors 32*b* and 32*c* are equal to each other (R32*b*=R32*c*), the potential on the connection node becomes half of the power source voltage Vcc of power voltage supply source 16. As a result, the reference voltage Vr obtained on the emitter of the transistor 28 is also given by the above Equation 2.

The current source 34 is constituted by the transistor 42, the resistor 44, a transistor 46 and a resistor 48. The collector of the transistor 46 is coupled in common to the emitters of the transistors 18*c* and 18*d*. The emitter of the transistor 46 is coupled to the negative terminal of the power voltage supply source 16 through the resistor 48. The collector of the transistor 42 is commonly coupled to the bases of the transistor 42 and the transistor 46. Thus, the current source 34 is formed in a current mirror fashion.

When assuming a current ratio of the current source 34 as 1:1, the controlled current I34 of the current source 34 is given as follows;

$$Ic=(Vcc/2)/R32a \tag{6}$$

The control voltage Vc is applied to the bases of the transistor 18*a* and 18*c* through the resistor 24*a*, as described before. The reference voltage Vr is also applied to the bases of the transistor 18*b* and 18*d*, as described before. When assuming the impedance Z26 of the variable resistor 26 is sufficiently lower than the resistance R24*a* of the resistor 24*a* (Z26<R24*a*), the control voltage Vc is also given by above Equation 1. The reference voltage Vr is given by above Equation 2.

The transistor 18*c* of the second differential circuit 10*b* is formed in the diode fashion, as described above. Thus, the second differential circuit 10*b* with the current feedback circuit 36 operates as a voltage follower circuit for the input applied to the base of the transistor 18*d*. The base of the transistor 18*c* operates as the output terminal of the voltage follower circuit. In the second differential circuit 10*b* as the voltage follower circuit, the base potential of the transistor 18*c* is maintained close to the base potential of the transistor 18*d*. Thus, the base potential of the transistor 18*c* being assumed as the reference voltage Vr, a current I24*a* flowing through the resistor 24*a* is given as follows:

$$\begin{aligned} I24a &= (Vc - Vc18c)/R24a \\ &= (\alpha - 1/2) \cdot Vcc/R24a \end{aligned} \tag{7}$$

where Vc18*c* is the base potential of the transistor 18*c*.

The collector current I18*c* of the transistor 18*c* is given as follows;

$$\begin{aligned} I18c &= I34/2 + [(\alpha - 1/2) \cdot Vcc/R24a]/2 \\ &= Vcc/(4 \cdot R32a) + (\alpha - 1/2) \cdot Vcc/(2 \cdot R24a) \end{aligned} \tag{8}$$

On the other hand: the collector current I18*d* of the transistor 18*d* is given as follows;

$$I18d = I34/2 - [(\alpha - 1/2) \cdot Vcc/R24a]/2 \quad (9)$$
$$= Vcc/(4 \cdot R32a) - (\alpha - 1/2) \cdot Vcc/(2 \cdot R24a)$$

A potential difference ΔV between the bases of the transistors 18c and 18d is given as follows, when assuming transistors, such as transistors 18c and 18d have the same saturation current Is;

$$\Delta V = Vt \cdot \ln (I18c/I18d) \quad (10)$$
$$= Vt \cdot \ln [Vcc/(4 \cdot R32a) + (\alpha - 1/2) \cdot Vcc/(2 \cdot R24a)]/$$
$$[Vcc/(4 \cdot R32a) - (\alpha - 1/2) \cdot Vcc/(2 \cdot R24a)]$$
$$= Vt \cdot \ln (23a - R32a + 2 \cdot \alpha \cdot R32a)/$$
$$(R24a + R32a - 2 \cdot \alpha \cdot R32a)$$

When assuming the resistance R24a is the same as the resistance R32a of the resistor 32a, Equation 10 is changed as follows;

$$\Delta V = Vt \cdot \ln 2 \cdot \alpha \cdot R32a/(2 \cdot R32a - 2 \cdot \alpha \cdot R32a) \quad (11)$$
$$= Vt \cdot \ln \alpha/(1 - \alpha)$$

The potential difference ΔV is given between the bases of the transistors 18a and 18b of the first differential circuit 10a. Thus, the collector currents Ic18a and Ic18b of the transistors 18a and 18b vary differentially in proportion to the potential difference ΔV. The ratio of the collector currents Ic18a and Ic18b is given as follows;

$$Ic18a/Ic18b = \text{Exp}\Delta V/Vt = \alpha/(1-\alpha) \quad (12)$$

The collector currents Ic18a and Ic18b vary differentially in reference to the control ratio α of the variable resistor 26. However, the sum of the collector currents Ic18a and Ic18b keeps the value equal to the input current Iin supplied by the current source 20. Thus, the following equation is given;

$$Ic18a + Ic18b = Iin \quad (13)$$

From Equations 12 and 13, the following equations are obtained in reference to the individual collector currents Ic18a and Ic18b;

$$Ic18a = \alpha.Iin \quad (14)$$

$$Ic18b = (1-\alpha).Iin \quad (15)$$

As is easily understood from Equations 14 and 15, the output currents Ic18a and Ic18b do not include terms of the power source voltage Vcc, the resistances R32a and R24a and the thermal voltage Vt.

Equation 11 is obtained by assuming the saturation currents of the transistors 18c and 18d are equal. The saturation currents are unified when the transistors 18c and 18d and the like are formed on the same integrated circuit chip. Particularly, the saturation currents are unified at a higher grade when the transistors 18c and 18d are formed in close proximity to each other. Thus, Equation 11 has a higher accuracy when the circuit is formed into an integrated circuit.

According to the first embodiment, as shown in FIG. 2, the first differential circuit 10a and second differential circuit 10b are coupled to each other so that the potential difference ΔV of the bases of the transistors 18c and 18d of the second differential circuit 10b is applied between the bases of the transistors 18a and 18b of the first differential circuit 10a.

The collectors of the transistors 18c and 18d of the second differential circuit 10b are coupled to each other through the current feedback circuit 36 so that the collector currents I18c and I18d thereof vary differentially but the sum thereof is kept controlled, e.g., to the constant current I34 of the current source 34 or the value given by power source voltage Vcc/(4.R32a).

The second differential circuit 10b is supplied with the controlled current I34 which is in proportion to the power source voltage Vcc. This is done by the current source 34, a part of which is constituted in the reference voltage supply circuit 14 coupled to the power voltage supply source 16.

The bases of the transistors 18c and 18d of the second differential circuit 10b are supplied with the control voltage Vc and the reference voltage Vr, respectively. Thus, the potential difference ΔV of the bases of the transistors 18c and 18d varies in proportion to the control voltage Vc.

The potential difference ΔV between the bases of the transistors 18c and 18d of the second differential circuit 10b is applied between the bases of the transistors 18a and 18b of the first differential circuit 10a. The thermal voltage Vt in the potential difference ΔV is then cancelled by the thermal voltage Vt in the first differential circuit 10a. As a result, the output currents Ic18a and Ic18b obtained by the first differential circuit 10a are protected from the influence of variations of the power source voltage Vcc, the resistances of the resistors and the variations in the thermal voltage Vt.

Figure 3:
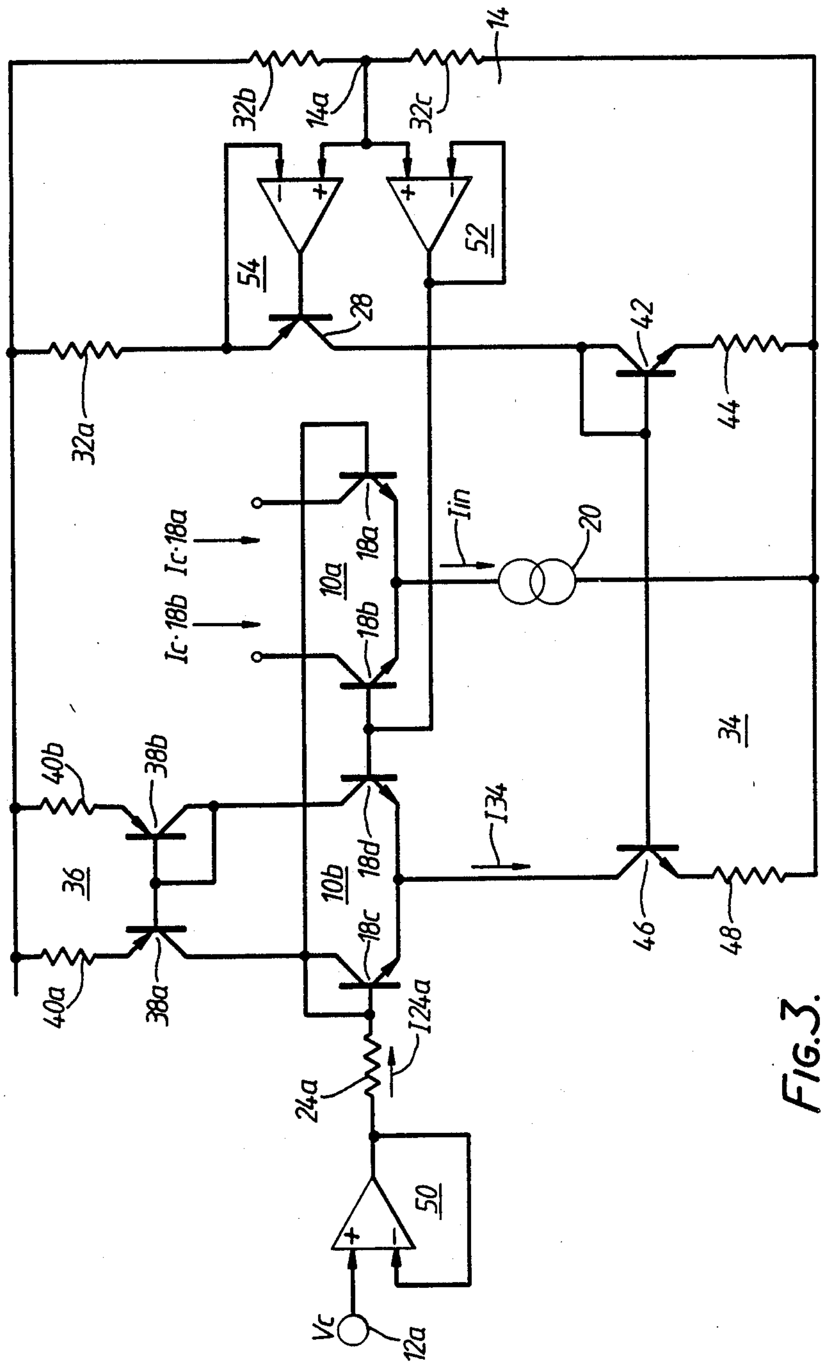
FIG. 3 is a schematic circuit diagram showing a second embodiment of the controlled current producing differential circuit apparatus according to the present invention.

Referring now to FIG. 3, a second embodiment of the control apparatus for a differential circuit according to the present invention will be described in detail.

In FIG. 3, the control apparatus is provided with a first differential circuit 10a and a second differential circuit 10b, a control voltage supply circuit 12, a reference voltage supply circuit 14 and a power voltage supply source 16. The control voltage supply circuit 12 and reference voltage supply circuit 14 supply the first differential circuit 10a and the second differential circuit 10b with a control voltage Vc and a reference voltage Vr, which are described later, respectively. The power voltage supply source 16 has a power source voltage Vcc.

The first differential circuit 10a, second differential circuit 10b are constituted similar to those in the first embodiment, as shown in FIG. 2. Therefore, the detail of the first differential circuit 10a, second differential circuit 10b will be eliminated from the following description, except where necessary.

The control voltage supply circuit 12 is constituted by a variable resistor 26 and a voltage follower circuit 50. The voltage follower circuit 50 is constituted by an operational amplifier 50a. The non-inversed input terminal of the operational amplifier 50a is coupled to the control voltage supply circuit 12. The output terminal of the operational amplifier 50a is coupled to the inversed input terminal thereof and the resistor 24a.

The variable resistor 26 is coupled across the power voltage supply source 16. An output terminal 26a of the variable resistor 26 is coupled to the transistor 18c of the second differential circuit 10b in series through an output terminal 12a of the control voltage supply circuit 12 and the voltage follower circuit 50. The output terminal 12*a* outputs the control voltage Vc from the control voltage supply circuit 12. The control voltage Vc is applied to the base of the transistor 18*c* through the voltage follower circuit 50 and the resistor 24*a*.

The reference voltage supply circuit 14 is constituted by a transistor 28, three resistors 32*a*, 32*b* and 32*c*, and two voltage follower circuits 52 and 54. The voltage follower circuits 52 and 54 are constituted similar to the voltage follower circuit 50. Further, the reference voltage supply circuit 14 includes a transistor 42 and a resistor 44. The transistor 42 and the resistor 44 constitute a current source 34 for the second differential circuit 10*b*, like the first embodiment, as shown in FIG. 2.

The resistors 32*b* and 32*c* are coupled in series across the power voltage supply source 16. The connection node between the resistors 32*b* and 32*c* operates as a reference voltage output terminal 14*a* of the reference voltage supply circuit 14 for outputting the reference voltage Vr. The connection node of the resistors 32*b* and 32*c*, i.e., the reference voltage output terminal 14*a*, is coupled to the non-inversed input terminals of the voltage follower circuit 52 is coupled to the base of the transistor 18*d* of second differential circuit 10*b*. Further, the output terminal of the voltage follower circuit 52 is coupled to the inversed input terminal thereof. Thus, the reference voltage Vr of the reference voltage supply circuit 14 is applied to the base of the transistor 18*d* of the second differential circuit 10*b* through the voltage follower circuit 52.

The output terminal of the voltage follower circuit 54 is coupled to the base of the transistor 28. Further, the output terminal of the voltage follower circuit 54 is coupled to the inversed input terminal thereof through the base and the emitter of the transistor 28. The collector of the transistor 28 is coupled to the negative terminal of the power voltage supply source 16 in series through the transistor 42 and the resistor 44. The emitter of the transistor 28 is coupled to the positive terminal of the power voltage supply source 16 through the resistor 32*a*.

The current source 34 is constituted similar to that in the first embodiment, as shown in FIG. 2. Therefore, the detail of the current source 34 will be eliminated from the following description, except where necessary.

In the second embodiment, the output terminal 12*a* of the control voltage supply circuit 12 (see FIG. 2) is coupled to the resistor 24*a* through the voltage follower circuit 50. Also, the reference voltage output terminal 14*a* is coupled to the base of the transistor 18*d* of the second differential circuit 10*b* and the base of the transistor 28 through the voltage follower circuits 52 and 54, respectively. The voltage follower circuit, such as the voltage follower circuits 50, 52 and 54, transmits an input voltage applied to the input terminal thereof to the output terminal thereof with a very high impedance. Therefore, the voltage follower circuit isolates an output circuit coupled to the output terminal from any influence due to the impedance of the input circuit coupled to the input terminal. However, the voltage follower circuit transmits the input voltage applied to the input terminal thereof to the output terminal as it is.

As a result, the control voltage Vc applied to the base of the transistor 18*c* of the second differential circuit 10*b* can respond to the power source voltage Vcc without any influence due to the impedance of the variable resistor 26 and/or the power voltage supply source 16. Thus, Equation 1 is applied with a higher accuracy. The voltage follower circuits 52 and 54 also isolate the second differential circuit 10*b* and the transistor 28 from any influence due to the impedance of the reference voltage supply circuit 14.

Now, a third embodiment of the control apparatus for a differential circuit according to the present invention will be described in detail. The control apparatus according to the third embodiment is provided with a pair of differential circuits, a control voltage supply circuit, a reference voltage supply circuit and a power voltage supply source. The reference voltage supply circuit and the power voltage supply source supply the first and second differential circuits with a control voltage Vc and a reference voltage Vr, which are described later, respectively. The power voltage supply source has a power source voltage Vcc.

Figure 4:
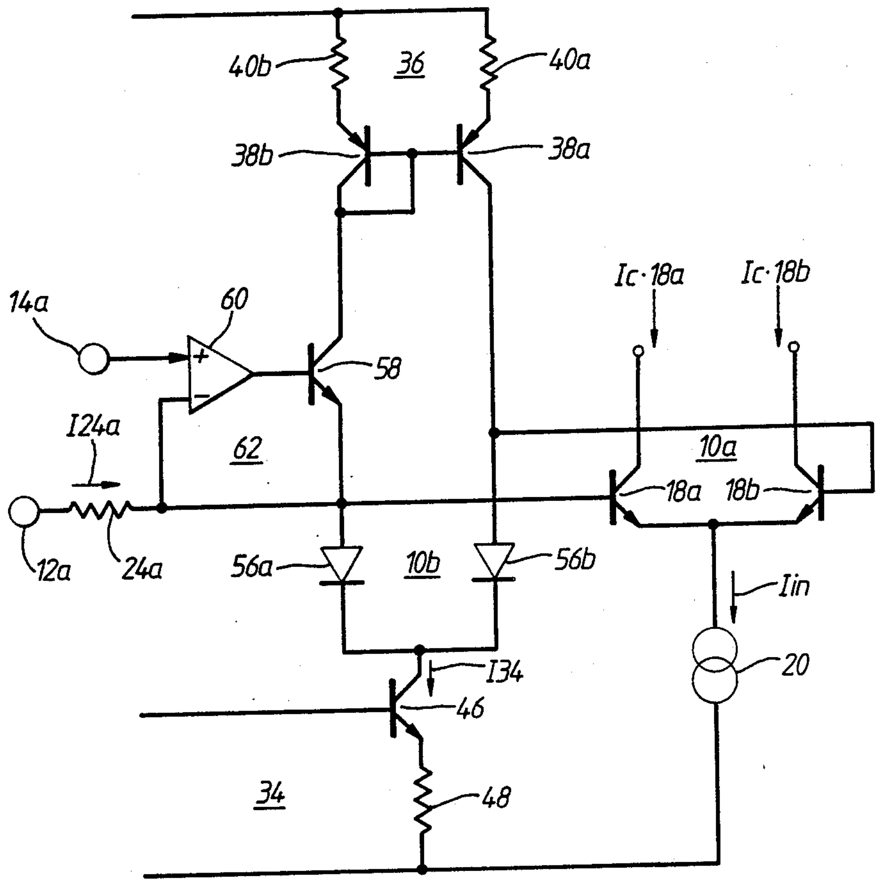
FIG. 4 is a schematic circuit diagram showing a third embodiment of the controlled current producing differential circuit apparatus according to the present invention.

FIG. 4 shows only the pair of differential circuits in the third embodiment. The other circuits, such as the control voltage supply circuit, the reference voltage supply circuit and the power voltage supply source are equivalent to those in the first and/or second embodiments, as shown in FIGS. 2 and/or 3. Therefore, the detail of the other circuits will be eliminated from the following description, except where necessary.

In FIG. 4, the first differential circuit 10*a* is constituted by a pair of transistors 18*a* and 18*b* and a current source 20. The current source 20 supplies an input current Iin subject to control of the control apparatus. The emitters of the transistors 18*a* and 18*b* are connected to the current source 20. The bases of the transistors 18*a* and 18*b* are coupled to the second differential circuit 10*b*, as described later. Both or either of the collector currents Ic18*a* and Ic18*b* of the transistors 18*a* and 18*b* are controlled outputs of the input current Iin supplied by the current source 20.

The second differential circuit 10*b* is constituted by a pair of diodes 56*a* and 56*b*, a current source 34, a current feedback circuit 36, a transistor 58 and an operational amplifier. The diodes 56*a* and 56*b* are made by a form of transistor in the integrated circuit configuration, similar to the diodes 30*a* and 30*b* of the first embodiment.

The current feedback circuit 36 is constituted by a pair of transistors 38*a* and 38*b* and a pair of resistors 40*a* and 40*b*, similar to the first and/or second embodiments, as shown in FIGS. 2 and/or 3. Therefore, the detail of the current feedback circuit 36 will be eliminated from the following description, except where necessary.

The transistor 58 and the operational amplifier 60 constitute a voltage follower circuit 62. In the voltage follower circuit 62, the non-inversed input terminal of the operational amplifier 60 is coupled to the reference voltage supply circuit (not shown). The inversed input terminal of the operational amplifier 60 is coupled to the control voltage supply circuit (not shown) through a resistor 24*a*. The output terminal of the operational amplifier 60 is coupled to the base of the transistor 58. The emitter of the transistor 58 is coupled to the inversed input terminal thereof and the anode of the diode 56*a*. The collector of the transistor 58 is coupled to the collector of the transistor 38*b* of the current feedback circuit 36.

The current source 34 supplies a prescribed controlled current I34 to the diodes 56*a* and 56*b*. The cathodes of the diodes 56*a* and 56*b* are connected to the current source 34. The current source 34 is also constituted similar to the first and/or second embodiments, as shown in FIGS. 2 and/or 3. Therefore, the detail of the current feedback circuit 36 will be eliminated from the following description, except where necessary.

The anode of the diode 56a is coupled to the control voltage supply circuit (not shown) through the resistor 24a, together with the inversed input terminal of the operational amplifier 60, as described above. Further, the anode of the diode 56a is coupled to the collector of the transistor 38b through the transistor 58. The anode of the diode 56b is coupled to the collector of the transistor 38a of the current feedback circuit 36.

In the third embodiment, as shown in FIG. 4, a current I56a flowing through the diode 56a is fed back to the diode 56b in series through the voltage follower circuit 62 and the current feedback circuit 36. Then, the voltage follower circuit 62 isolates the resistor 24a from influence due to the impedance of the diode 56a. As a result, the control voltage Vc applied to the resistor 24a is converted to the corresponding current with a higher accuracy.

Figure 5:
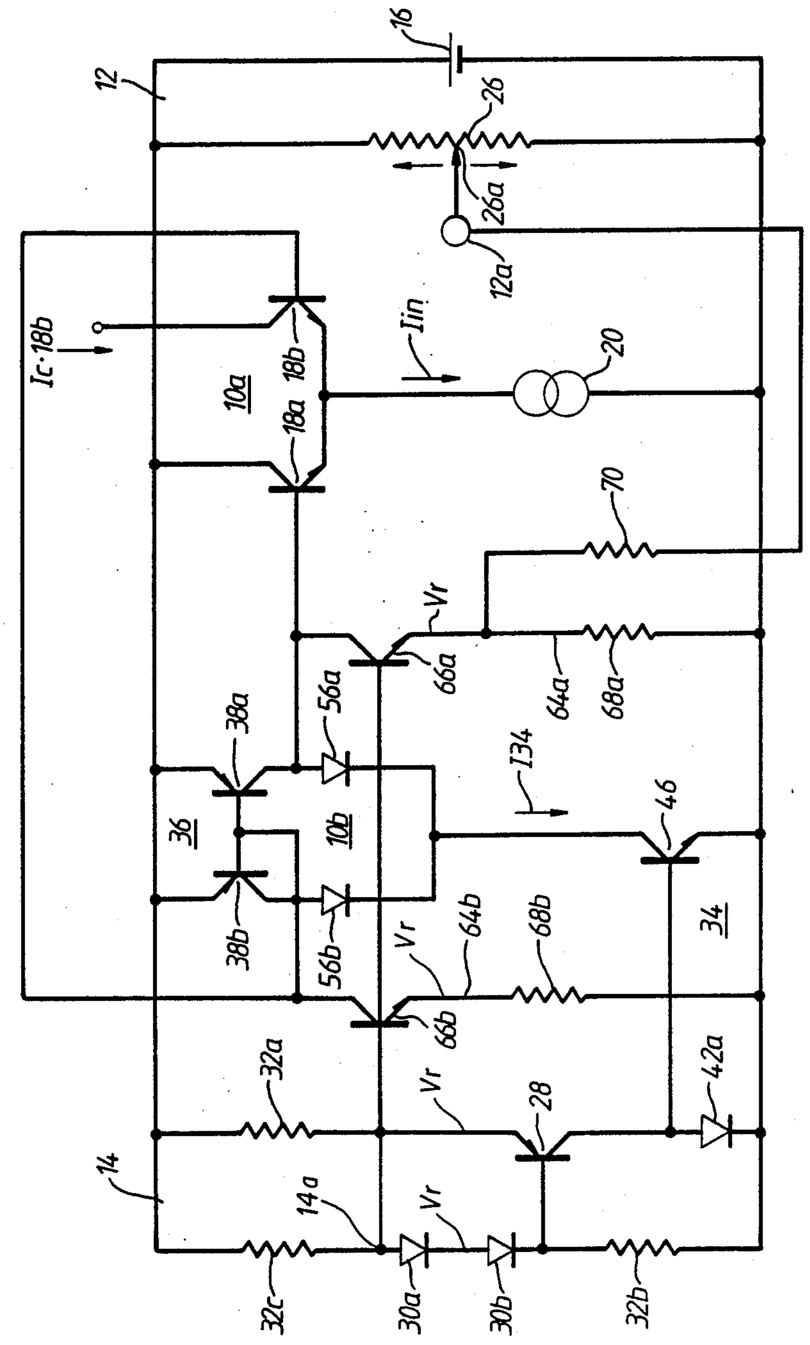
FIG. 5 is a schematic circuit diagram showing a fourth embodiment of the differential circuit control apparatus according to the present invention.

Referring now to FIG. 5, a fourth embodiment of the control apparatus for a differential circuit according to the present invention will be described in detail.

In FIG. 5, the control apparatus is provided with a first differential circuit 10a and a second differential circuit 10b, a control voltage supply circuit 12, a reference voltage supply circuit 14 and a power voltage supply source 16. The control voltage supply circuit 12 and reference voltage supply circuit 14 supply the second differential circuit 10b with a control voltage Vc and a reference voltage Vr, which are described later. The power voltage supply source 16 has a power source voltage Vcc.

The first differential circuit 10a is constituted similar to the differential circuit 10 of the first embodiment, as shown in FIG. 2. Therefore, the detail of the first differential circuit 10a will be eliminated from the following description, except where necessary.

The second differential circuit 10b is constituted by a pair of diodes 56a and 56b, a current source 34 and a current feedback circuit 36. Further, the second differential circuit 10b includes a pair of voltage/current converting circuits 64a and 64b.

The diodes 56a and 56b are made by a form of transistor in the integrated circuit configuration, similar to the diodes 30a and 30b of the first embodiment. The anodes of the diodes 56a and 56b are coupled to the bases of the transistors 18a and 18b of the first differential circuit 10a, respectively.

The current source 34 is constituted by a pair of transistors 42a and 46, similar to the first embodiment, as shown in FIG. 2. The transistor 42a is shown by the symbol of a diode in the drawing for convenience. Further, the current source 34 of the fourth embodiment does not include resistors corresponding to the resistor 44 and the resistor 48 in the first embodiment. However, the current source 34 of the fourth embodiment achieves a current mirroring operation almost the same as the current source 34 of the above embodiments. Therefore, the detail of the current source 34 will be eliminated from the following description, except where necessary.

The current feedback circuit 36 is constituted by a pair of transistors 38a and 38b, similar to the first to third embodiments, as shown in FIGS. 2, 3 and 4. The current feedback circuit 36 of the fourth embodiment does not include resistors corresponding to the resistors 40a and 40b in the above embodiments. However, the current feedback circuit 36 of the fourth embodiment achieves a current feedback operation almost the same as the current feedback circuit 36 of the above embodiments. Therefore, the detail of the current feedback circuit 36 will be eliminated from following description, except where necessary. The current source 34 supplies a prescribed controlled current I34 to the diodes 56a and 56b.

The cathodes of diodes the 56a and 56b are connected to the current source 34. The anodes of the diodes 56a and 56b are coupled to the transistors 38a and 38b of the current feedback circuit 36, respectively. Further, the anodes of the diodes 56a and 56b are coupled to the control voltage supply circuit 12 and reference voltage supply circuit 14 through the voltage/current converting circuits 64a and 64b. The voltage/current converting circuit 64a includes a transistor 66a and a resistor 68a. The collector of the transistor 66a is coupled to the anode of the diode 56a. The emitter of the transistor 66a is coupled to the negative terminal of the power voltage supply source 16 through the resistor 68a. The emitter of the transistor 66a is also coupled to the control voltage supply circuit 12 through a resistor 70 for receiving the control voltage Vc of the control voltage supply circuit 12. The voltage/current converting circuit 64b also includes a transistor 66b and a resistor 68b. The collector of the transistor 66b is coupled to the anode of the diode 56b. The emitter of the transistor 66b is coupled to the negative terminal of the power voltage supply source 16 through the resistor 68b. The bases of the transistors 66a and 66b are coupled to the anode of the diode 30a together.

The control voltage supply circuit 12 is constituted similar to the control voltage supply circuit 12 in the first embodiment, as shown in FIG. 2. Therefore, the detail of the control voltage supply circuit 12 will be eliminated from following description, except where necessary.

The reference voltage supply circuit 14 is also constituted similar to the reference voltage supply circuit 14 in the first embodiment, as shown in FIG. 2. Therefore, the detail of the reference voltage supply circuit 14 will be eliminated from the following description, except where necessary.

The reference voltage supply circuit 14 prevents the reference voltage Vr on the anode of the diode 30b and the emitter of the transistor 28, respectively. The reference voltage Vr occurs on the emitters of the transistors 66a and 66b of the first and second voltage/current converting circuits 64a and 64b of the second differential circuit 10b. The reference voltage Vr has a prescribed relation with the power source voltage Vcc of the power voltage supply source 16. When assuming the reference voltage Vr is given as follows:

$$Vr = \beta . Vcc \quad (16)$$

wherein $\beta$ is a fraction less than one ($0 \leqq \beta \leqq 1$).

When assuming the resistances R32b and R32c of the resistors 32b and 32c are equal to each other, the decimal $\beta$ takes the value of 0.5. That is, the reference voltage supply circuit 14 provides a reference voltage Vr at half of the power source voltage Vcc.

The current source 34 is coupled to the reference voltage supply circuit 14, as described before. Therefore, the current source 34 provides a controlled current I34 given as follows;

$$I34 = (1 - \beta) . Vcc / R32a \quad (17)$$

wherein R32*a* is the resistance of the resistor R32*a*.

The voltage/current converting circuit **64*b*** converts the reference voltage Vr to the current I64*b*. The current I64*b* flows through the transistor **66*b*** and is given as follows;

$$I64b=\beta.Vcc/R68b \quad (18)$$

wherein R68*b* is the resistance of the resistor **68*b***.

The control voltage supply circuit 12 provides the control voltage Vc. The control voltage Vc is given by Equation 1, similar to the first embodiment, as shown in FIG. 2. Here, Equation 1 will be again referred for convenience;

$$Vc=\alpha.Vcc \quad (1)$$

The voltage/current converting circuit **64*a* is coupled to both the control voltage supply circuit 12 and the reference voltage supply circuit 14 for receiving the through the diode 30*a* and the control voltage Vc reference voltage Vr. As a result, the voltage/current converting circuit 64*a*** provides a current I64*a* in response to the control voltage Vc and the reference voltage Vr. The current I64*a* is then given as follows;

$$I64a=\beta.Vcc/R68b+(\beta-\alpha).Vcc/R70 \quad (19)$$

wherein R68*a* and R70 are the resistances of the resistors **68*a* and 70**.

The current feedback circuit 36 transmits a current corresponding to the difference between the current I64*a* and the current I64*b* to the circuit of the diodes **56*a* and 56*b*. When assuming the current mirroring ratio of the current feedback circuit 36** is 1:1, the following relation is achieved;

$$I56b-I56a=I64a-I64b \quad (20)$$

wherein I56*b* and I56*a* are the currents flowing through the resistors **56*b* and 56*a***, respectively.

The currents I56*b* and I56*a* vary differentially in response to the difference between the current I64*a* and I64*b*, but the sum of the currents I56*a* and I56*b* is kept to the same as the controlled current I34 of the current source 34. Then, the following relation is achieved;

$$I56b+I56a=I34 \quad (21)$$

The currents I64*a* and I64*b* are then given as follows, from Equations 20 and 21;

$$I56a=(I34-I64a+I64b)/2 \quad (22)$$

$$I56b=(I34+I64a-I64b)/2 \quad (23)$$

The anode potential difference ΔVa between the diodes **56*a* and 56*b*** is then given as follows;

$$\begin{aligned}\Delta Va &= Vt\cdot\ln I56b/I56a \quad (24)\\ &= Vt\cdot\ln(I34+I64a-I64b)/(I34-I64a+I64b)\end{aligned}$$

When assuming the resistances R32*a*, R68*a*, R68*b* and R70 have the same value R, Equation 24 is changed as follows;

$$\Delta Va=Vt.ln[(1-\alpha).Vcc/R]/(-1+\alpha-2.\beta).Vcc/R=Vt.ln(1-\alpha)/(1+\alpha-2.\beta) \quad (25)$$

The potential difference ΔVa is given between the bases of the transistors **18*a* and 18*b* of the first differential circuit 10*a***. Thus, the collector currents Ic18*a* and Ic18*b* of the transistors **18*a* and 18*b*** vary differentially in proportion to the potential difference ΔVa. The ratio γ of the collector currents Ic18*a* and Ic18*b* is given as follows;

$$Ic18b/Ic18a=\text{Exp}\Delta Va/Vt=(1-\alpha)/(1+\alpha-2.\beta) \quad (26)$$

The collector currents Ic18*a* and Ic18*b* vary differentially in reference to the control ratio α of the variable resistor 26. However, the sum of the collector currents Ic18*a* and Ic18*b* keeps the value equal to the input current I in supplied by the current source 20. Thus, the above Equation 13 is also given. Here, Equation 13 will be again referred for convenience;

$$Ic18a+Ic18b=Iin \quad (13)$$

From Equations 13 and 26, the following equations are obtained in reference to the individual collector currents Ic18*a* and Ic18*b*;

$$Ic18a=[1/(1+\gamma)].Iin \quad (27)$$

$$Ic18b=[2/(1+\gamma)].Iin \quad (28)$$

When assuming the ratio β for the reference voltage Vr takes the value of 0.5, as described before, Equation 26 is changed as follows;

$$\gamma=(1-\alpha)/\alpha \quad (29)$$

Equations 27 and 28 are changed as follows;

$$Ic18a=\alpha.Iin \quad (30)$$

$$Ic18b=(1-\alpha).Iin \quad (31)$$

As is easily understood from Equations 30 and 31, the output currents Ic18*a* and Ic18*b* do not include terms of the power source voltage Vcc, the resistances R32*a*, R24*a* and the thermal voltage Vt.

According to the fourth embodiment, as shown in FIG. 5, the first differential circuit **10*a* and second differential circuit 10*b* are coupled to each other so that the potential difference ΔVa of the anodes of the diodes 56*a* and 56*b* of the second differential circuit 10*b* is applied between the bases of the transistors 18*a* and 18*b* of the first differential circuit 10*a***.

The voltage/current converting circuits **64*a* and 64*b* are coupled to the anodes of the diodes 56*a* and 56*b* of the second differential circuit 10*b* through the current feedback circuit 36** so that the currents I56*a* and I56*b* thereof vary differentially, but the sum thereof is kept constant, e.g., to the controlled current I34 of the current source 34.

The second differential circuit **10*b* is supplied with the controlled current I34 which is in proportion to the power source voltage Vcc. This is done by the current source 34, a part of which is constituted in the reference voltage supply circuit 14 coupled to the power voltage supply source 16**.

The diodes **56*a* and 56*b* of the second differential circuit 10*b* are supplied with the control voltage Vc and the reference voltage Vr, respectively. Thus, the potential difference ΔVa of the anodes of the diodes 56*a*** and 56*b* varies in proportion to the control voltage Vc. However, the potential difference ΔVa is independent of variations in the power source voltage Vcc, the resistances of the resistors and the variations in the thermal voltage Vt of the diodes **56*a* and 56*b*** and the like.

The potential difference ΔVa between the anodes of the diodes **56*a* and 56*b* of the second differential circuit 10*b* is applied between the bases of the transistors 18*a* and 18*b* of the first differential circuit 10*a*. The thermal voltage Vt in the potential difference ΔVa is then cancelled by the thermal voltage Vt at the first differential circuit 10*a*. As a result, the output currents Ic18*a* and Ic18*b* obtained by the first differential circuit 10*a*** are protected from the influence of variations of the power source voltage Vcc, the resistances of the resistors or the variation in the thermal voltage Vt.

Figure 6:
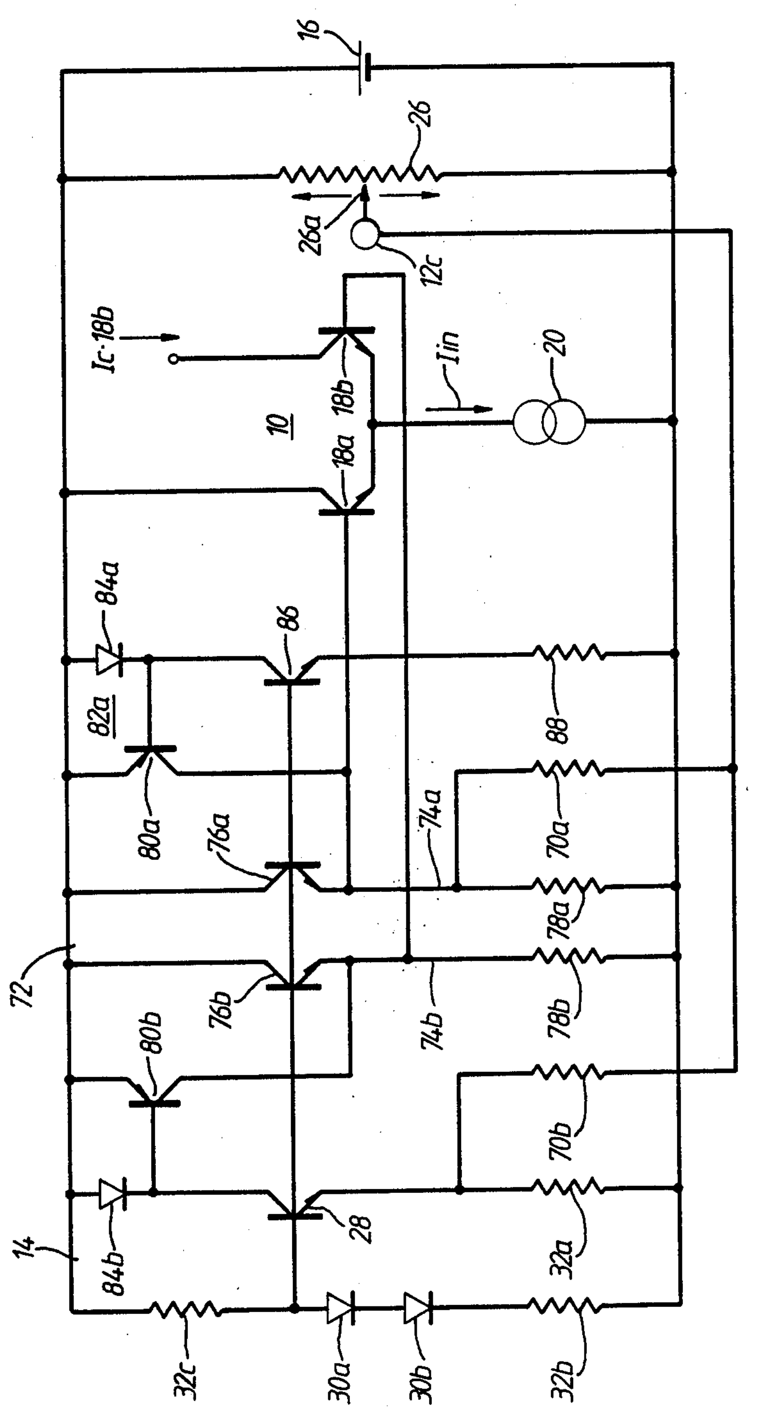
FIG. 6 is a schematic circuit diagram showing a fifth embodiment of the controlled current producing differential circuit apparatus according to the present invention.
Figure 6A:
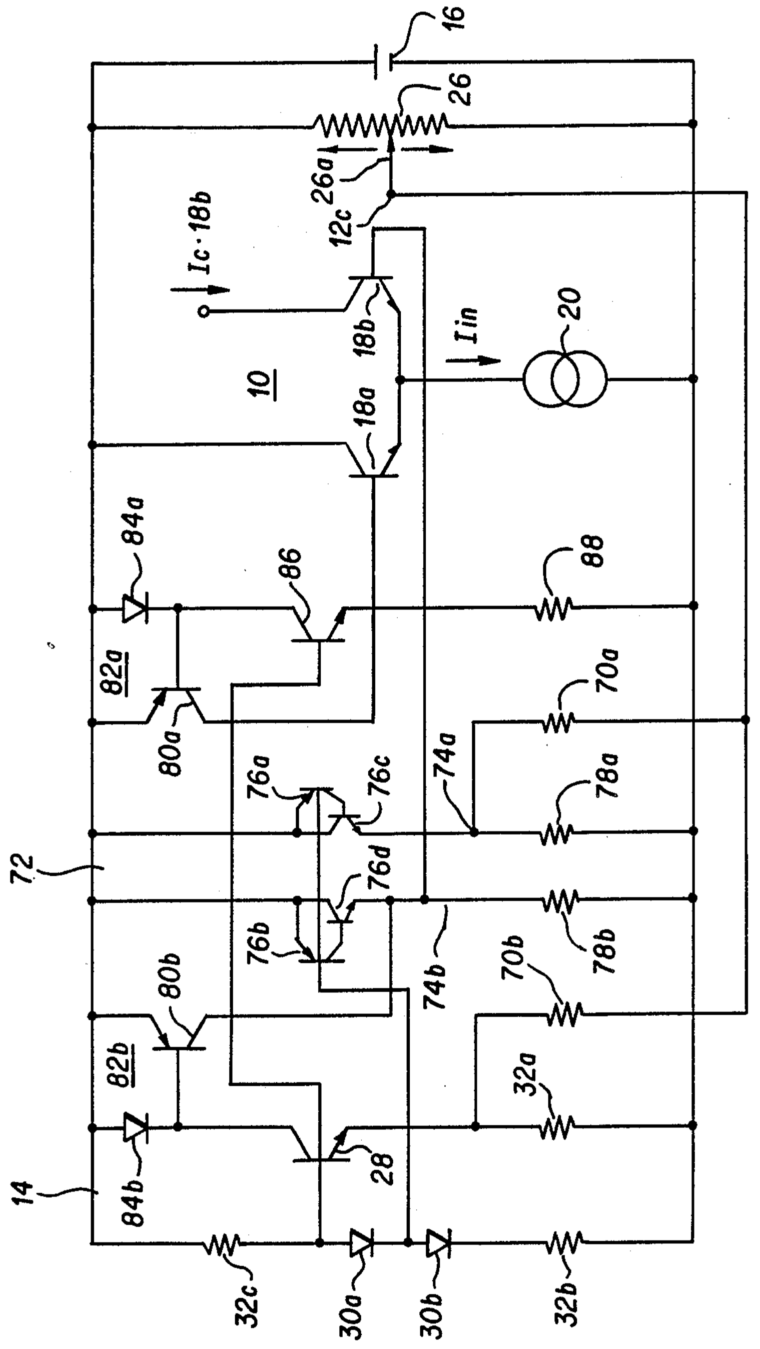

Referring now to FIG. 6, a fifth embodiment of the control apparatus for a differential circuit according to the present invention will be described in detail.

In the fourth embodiment, as shown in FIG. 5, the transistors **38*a* and 38*b* of the current feedback circuit 36 provide the diodes 56*a* and 56*b* of the second differential circuit 10*b* with the differential current between the voltage/current converting circuits 64*a* and 64*b* in response to the control voltage Vc. As a result, the potential difference ΔVa is obtained. The potential difference ΔVa varies in common both when increasing and decreasing. By contrast, in the fifth embodiment, as shown in FIG. 6**, the potential difference ΔVa is produced by two independent circuits, which will be described in detail below.

In FIG. 6, the control apparatus is provided with a differential circuit 10, a control voltage supply circuit 12, a reference voltage supply circuit 14, a power voltage supply source 16 and a compensation voltage producing circuit 72. The control voltage supply circuit 12 and reference voltage supply circuit 14 supply the differential circuit 10 and the compensation voltage producing circuit 72 with a control voltage Vc and a reference voltage Vr, which are described later, respectively. The power voltage supply source 16 has a power source voltage Vcc.

The differential circuit 10 is constituted similar to the first differential circuit **10*a* of the first embodiment, as shown in FIG. 2. Therefore, the detail of the differential circuit 10** will be eliminated from following description, except where necessary.

The reference voltage supply circuit 14 is also constituted similar to the reference voltage supply circuit 14 of the fourth embodiment, as shown in FIG. 5. The base of the transistor 28 is coupled to the anode of the diode **30*a*. However, the transistor 28 is opposite in conductivity to the transistor 28 of the fourth embodiment. Thus, the emitter of the transistor 28 also provides a potential the same as the potential between the diodes 30*a* and 30*b*. The reference voltage supply circuit 14 provides a reference voltage Vr. The reference voltage Vr is supplied from the emitter of the transistor 28 to the compensation voltage producing circuit 72 and the differential circuit 10. The reference voltage Vr has a prescribed relation with the power source voltage Vcc of the power voltage supply source 16**. When assuming the reference voltage Vr is given as follows;

$$Vr=\beta.Vcc \quad (16)$$

wherein $\beta$ is the voltage dividing ratio of the power source voltage Vcc, less than one ($0 \leqq \beta \leqq 1$).

When assuming the resistances R**32*b* and R32*c* of the resistors 32*b* and 32*c* are equal to each other, the voltage dividing ratio $\beta$ takes the value of 0.5. That is, the reference voltage supply circuit 14** provides a reference voltage Vr of half of the power source voltage Vcc.

The compensation voltage producing circuit 72 includes a pair of voltage/current converting circuits **74*a* and 74*b*, which are parallelly coupled to the power voltage supply source 16. The voltage/current converting circuit 74*a* is comprised of a transistor 76*a* and a resistor 78*a* connected in series. The emitter of the transistor 76*a* is coupled to power voltage supply source 16 through a transistor 80*a*. The transistor 80*a* forms a first current mirror circuit 82*a* together with a diode 84*a*. The diode 84*a* is coupled to the power voltage supply source 16, in series with a transistor 86 and a resistor 88. The voltage/current converting circuit 74*b* is comprised of a transistor 76*b* and a resistor 78*b* connected in series. The emitter of the transistor 76*b* is coupled to power voltage supply source 16 through a transistor 80*b*. The transistor 80*b* forms a second current mirror circuit 82*b* together with a diode 84*b*, which is connected in series with the transistor 28 of the reference voltage supply circuit 14. The bases of the transistors 76*a*, 76*b* and 86 are coupled to the base of the transistor 28**.

The emitters of the transistor **76*a* and the transistor 28 are coupled to the control voltage supply circuit 12 through resistors 70*a* and 70*b*, respectively, for receiving the control voltage Vc of the control voltage supply circuit 12. The emitters of the transistors 76*a* and 76*b* are coupled to the bases of the transistor 18*a* and the transistor 18*b* of the differential circuit 10**.

The operation of the fifth embodiment, as shown in FIG. 6, will be described below. Now, assume that the resistances R88, R**32*a*, R70*a* and R70*b* of the resistors 88, 32*a*, 70*a* and 70*b* are the same and the resistances R78*a* and R78*b* of the resistors 78*a* and 78*b*** are half of the resistances (i.e., R88=R32*a*=R70*a*R70*b*=2.R78*a*=2.R78*b*). Further, the bases of the transistors **76*a*, 76*b* and 86 are coupled to the bases of the transistor 28, as described above. Thus, the emitter potentials of the transistors 76*a*, 76*b* and 86** are kept to the reference voltage Vr or the voltage of $\beta$.Vcc.

In the fifth embodiment, as shown in FIG. 6, a potential difference ΔVa arises between the emitters of the voltage/current converting circuits **74*a* and 74*b* of the compensation voltage producing circuit 72. The potential difference ΔVa varies in response to the control voltage Vc of the control voltage supply circuit 12, similar to the fourth embodiment, as shown in FIG. 5**.

The potential difference ΔVa is given between the bases of the transistors **18*a* and 18*b* of the first differential circuit 10. Thus, the collector currents Ic18*a* and Ic18*b* of the transistors 18*a* and 18*b* vary differentially in proportion to the potential difference ΔVa, similar to the fourth embodiment. Therefore, the output currents Ic18*a* and Ic18*b* of the differential circuit 10 also do not include terms for the power source voltage Vcc, the resistances R32*a*, R70*a*, R70*b*** or the thermal voltage Vt.

The compensation voltage producing circuit 72 of the fifth embodiment can be modified as shown in FIG. 6(*a*). In FIG. 6(*a*), a pair of PNP transistors **76*c* and 76*d* are coupled to the transistors 76*a* and 76*b* of the compensation voltage producing circuit 72, respectively, in the conventional cascade configuration. Therefore, the emitters of the PNP transistors 76*c* and 76*d* are coupled to the collectors of the transistors 76*a* and 76*b*. The bases of the PNP transistors are coupled to the emitters of the transistors 76a and 76b. The collectors of the transistors 80a and 80b are coupled to the collectors of the PNP transistors 76c and 76d. Further, the bases of the transistor 18a and the transistor 18b of the first differential circuit 10a are coupled to the collectors of the PNP transistors 76c and 76d**.

In the fifth embodiment, as shown in FIG. 6, the resistor 88, the resistor 32a, and the resistors 78a and 78b operate as current sources. Therefore, the resistor 88, the resistor 32a, and the resistors 78a and 78b can be replaced by constant current sources formed by current mirror circuits together with a diode coupled in the reference voltage supply circuit 14.

Figure 7:
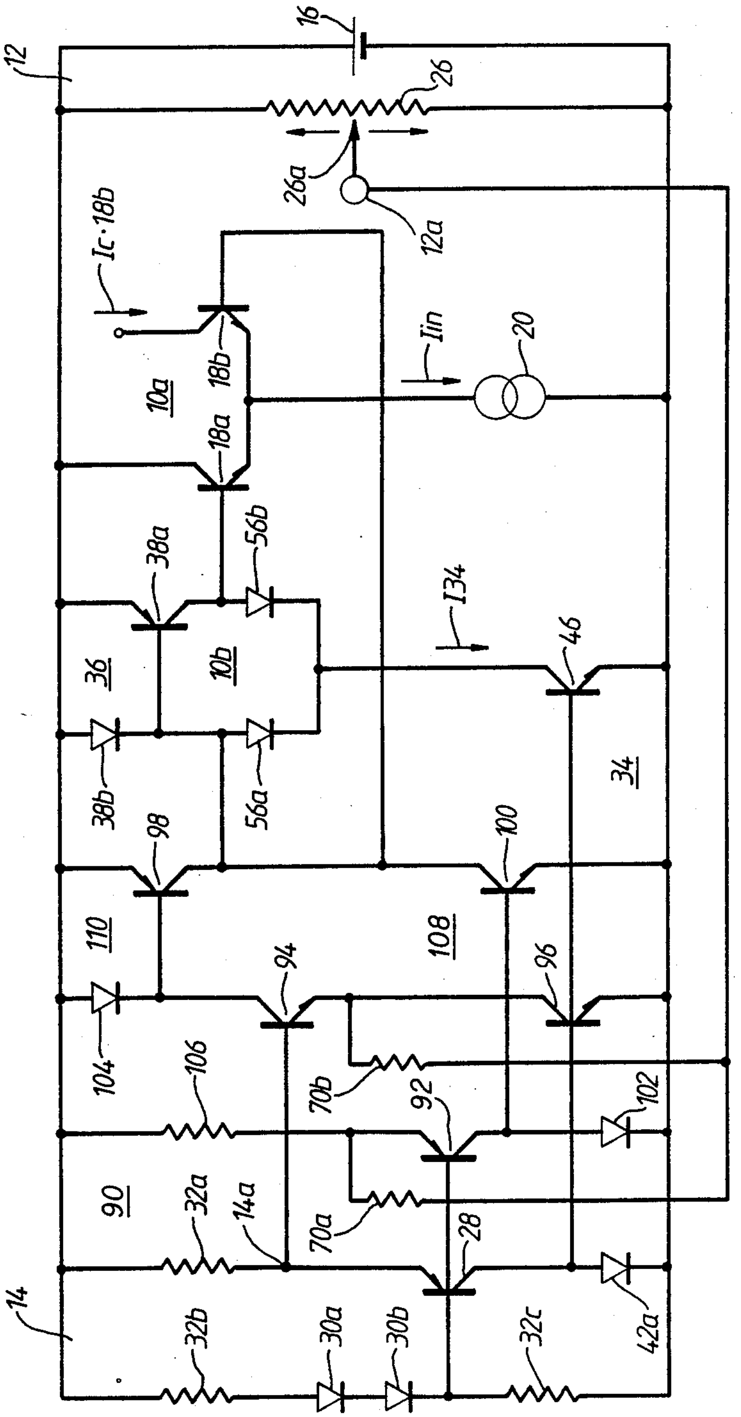
FIG. 7 is a schematic circuit diagram showing a sixth embodiment of the controlled current producing differential circuit apparatus according to the present invention.

Referring now to FIG. 7, a sixth embodiment of the control apparatus for a differential circuit according to the present invention will be described in detail. In the sixth embodiment, currents differentially applied to the first differential circuit 10a and second differential circuit 10b are given by a single ended push-pull circuit.

In FIG. 7, the control apparatus is provided with the first differential circuit 10a and second differential circuit 10b, a control voltage supply circuit 12, a reference voltage supply circuit 14, a power voltage supply source 16 and a current supply circuit 90. The control voltage supply circuit 12 and reference voltage supply circuit 14 supply the first differential circuit 10a and the compensation voltage producing circuit 72 with a control voltage Vc and a reference voltage Vr, which are described later, respectively. The power voltage supply source 16 has a power source voltage Vcc.

The first differential circuit 10a and second differential circuit 10b are constituted similar to those of the fourth embodiment, as shown in FIG. 5. Therefore, the detail of the first differential circuit 10a and the second differential circuit 10b will be eliminated from the following description, except where necessary.

The reference voltage supply circuit 14 is also constituted similar to the reference voltage supply circuit 14 of the fourth embodiment, as shown in FIG. 5. The reference voltage supply circuit 14 provides a reference voltage Vr.

The current supply circuit 90 includes five transistors 92, 94, 96, 98 and 100, and two diodes 102 and 104. The transistor 92 and the diode 102 are coupled to the power voltage supply source 16 in series with a resistor 106. The transistors 94 and 96 are coupled to the power voltage supply source 16 in series with the diode 104. The diode 102 forms a first current mirror circuit 108 together with the transistor 100. The diode 104 also forms a second current mirror circuit 110 together with the transistor 98. The transistors 98 and 100 are coupled in the single ended push-pull circuit configuration. That is, the collectors of the transistors 98 and 100 are connected in common. The connection node of the collectors of the transistors 98 and 100 generates a voltage output, which varies in push-pull relation to the currents of the transistors 98 and 100.

The emitters of the transistors 92 and 94 are coupled to the control voltage supply circuit 12 through resistors 70a and 70b, respectively, for receiving the control voltage Vc of the control voltage supply circuit 12. The connection node between the collectors of the transistors 98 and 100 is connected to the base of the transistor 18b of the first differential circuit 10a and the anode of the diode 56b of the second differential circuit 10b. The base of the transistor 18a of the first differential circuit 10a and the anode of the diode 56b of the second differential circuit 10b are coupled together.

In the sixth embodiment, as shown in FIG. 7, the reference voltage Vr of the reference voltage supply circuit 14 appears on both the emitters of the transistors 92 and 94. On the other hand, the control voltage Vc of the control voltage supply circuit 12 is applied to both the emitters of the transistors 92 and 94. Thus, the currents of the transistors 92 and 94 varies in response to the control voltage Vc of the control voltage supply circuit 12. The current of the transistor 92 is transferred to the transistor 100 due to the current mirror function of the first current mirror circuit 108. Also, the current of the transistor 94 is transferred to the transistor 98 due to the current mirror function of the second current mirror circuit 110. The output voltage of the current supply circuit 90 responsive in the push-pull relation to the control voltage Vc of the control voltage supply circuit 12 is applied to the first differential circuit 10a and the second differential circuit 10b.

In the sixth embodiment, as shown in FIG. 7, a potential difference ΔVa arises between the anodes of the diodes 56a and 56b of the second differential circuit 10b and the bases of the transistor 18a and the transistor 18b of the first differential circuit 10a. The potential difference ΔVa varies in response to the control voltage Vc of the control voltage supply circuit 12, similar to the fourth embodiment, as shown in FIG. 5. Thus, the collector currents Ic18a and Ic18b of the transistors 18a and 18b vary differentially in proportion to the potential difference ΔVa, similar to the fourth embodiment. Therefore, the output currents Ic18a and Ic18b of the first differential circuit 10a also do not include any terms of the power source voltage Vcc, the resistances R32a, R70a, R70b and the thermal voltage Vt.

As described above, the present invention can provide an extremely preferable controlled current producing differential circuit apparatus.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A controlled current producing differential circuit apparatus, comprising:

control voltage supply means for supplying a control voltage in response to a power supply voltage subject to unexpected fluctuation;

reference voltage supply means responsive to the power supply voltage for supplying a predetermined reference voltage; and differential circuit means coupled to the control voltage supply means and the reference voltage supply means for outputting a controlled output current in response to the difference between the control voltage and the reference voltage and for compensating for fluctuations in the power supply voltage.

2. The apparatus of claim 1 wherein the differential circuit means includes two differential circuits coupled in parallel to each other, one differential circuit including a current source responsive to the power supply voltage and a current feedback circuit, the other differential circuit including an input current source for applying an input current subjected to control and at least one current outputting means for supplying the controlled output current.

3. The apparatus of claim 1 wherein the reference voltage supply means includes at least one resistor having a corresponding impedance, and reference voltage follower means for compensating for the impedance of the diode.

4. The apparatus of claim 1 wherein the control voltage supply means includes at least one variable resistor, and control voltage follower means for compensating for the impedance of the variable resistor.

5. The apparatus of claim 1 wherein the control voltage supply means includes at least one fixed resistor, and voltage follower circuit means for compensating for the impedance of the fixed resistor.

6. The apparatus of claim 1 wherein the differential circuit means includes two differential circuits coupled in parallel to each other, one differential circuit including a voltage/current converting means for converting the reference voltage and the reference voltage to a reference current and a control current, respectively.

7. The apparatus of claim 6 wherein the other differential circuit includes a single ended push-pull means for supplying the reference current and the control current to the differential circuit means.

8. The apparatus of claim 1 wherein the differential circuit means includes a differential circuit and a pair of voltage/current converting means for differentially converting the reference voltage and the reference voltage to a reference current and a control current, respectively.

9. The apparatus of claim 8 wherein each of the voltage/current converting means includes a pair of transistors coupled in parallel with the power supply voltage and a current mirror circuit coupled between the transistors.

* * * * *